(12) United States Patent
Lachab

(10) Patent No.: US 11,984,529 B2
(45) Date of Patent: May 14, 2024

(54) SEMICONDUCTOR HETEROSTRUCTURE WITH P-TYPE SUPERLATTICE

(71) Applicant: Sensor Electronic Technology, Inc., Columbia, SC (US)

(72) Inventor: Mohamed Lachab, West Columbia, SC (US)

(73) Assignee: Sensor Electronic Technology, Inc., Columbia, SC (US)

( * ) Notice: Subject to any disclaimer, the term of this patent is extended or adjusted under 35 U.S.C. 154(b) by 481 days.

(21) Appl. No.: 16/930,819

(22) Filed: Jul. 16, 2020

(65) Prior Publication Data

US 2020/0350465 A1 Nov. 5, 2020

Related U.S. Application Data

(63) Continuation of application No. 16/148,360, filed on Oct. 1, 2018, now abandoned.

(60) Provisional application No. 62/566,420, filed on Sep. 30, 2017.

(51) Int. Cl.
| | |
|---|---|
| *H01L 33/06* | (2010.01) |
| *H01L 29/00* | (2006.01) |
| *H01L 33/10* | (2010.01) |
| *H01L 33/02* | (2010.01) |
| *H01L 33/14* | (2010.01) |
| *H01L 33/32* | (2010.01) |

(52) U.S. Cl.
CPC ............. *H01L 33/06* (2013.01); *H01L 29/00* (2013.01); *H01L 33/10* (2013.01); *H01L 33/025* (2013.01); *H01L 33/145* (2013.01); *H01L 33/32* (2013.01)

(58) Field of Classification Search
CPC .................................................. H01L 33/06
USPC ........................................................ 257/13
See application file for complete search history.

(56) References Cited

U.S. PATENT DOCUMENTS

| | | | |
|---|---|---|---|
| 7,893,424 B2 | 2/2011 | Eichler et al. | |
| 9,647,168 B2 | 5/2017 | Jain et al. | |
| 9,653,631 B2 | 5/2017 | Jain et al. | |
| 9,768,349 B2 | 9/2017 | Shur et al. | |
| 10,069,034 B2 | 9/2018 | Jain et al. | |
| 2006/0131558 A1* | 6/2006 | Sato .................. | H01S 5/34333 |
| | | | 257/17 |
| 2015/0048397 A1 | 2/2015 | Northrup et al. | |

(Continued)

OTHER PUBLICATIONS

Kim, J.K., Waldron, Li, Gessman, Schubert, Jang, and Lee, "P-type conductivity in bulk AlxGa1-xN and AlxGa1-xN/AlyGa1-yN superlattices with average Al mole fraction >20%," Applied Physics Letter, vol. 84, No. 17, 3310, Apr. 26, 2004, 3 pages.

(Continued)

*Primary Examiner* — Hsin Yi Hsieh
(74) *Attorney, Agent, or Firm* — LaBatt, LLC

(57) ABSTRACT

A heterostructure for an optoelectronic device is disclosed. The heterostructure includes an active region including at least one quantum well and at least one barrier and an electron blocking layer located adjacent to the active region, wherein the electron blocking layer includes a region of graded composition. An asymmetric p-type superlattice layer is located adjacent to the electron blocking layer, wherein the p-type superlattice includes at least one superlattice period comprising a set of wells and a set of barriers. A thickness of at least one of: each well in the set of wells or each barrier in the set of barriers varies along a length of the p-type superlattice.

20 Claims, 7 Drawing Sheets

(56) References Cited

U.S. PATENT DOCUMENTS

| | | |
|---|---|---|
| 2017/0084779 A1 | 3/2017 | Moe et al. |
| 2017/0092807 A1* | 3/2017 | Okuno ................ H01L 33/0025 |
| 2017/0263805 A1 | 9/2017 | Jain et al. |
| 2018/0108805 A1 | 4/2018 | Shatalov et al. |
| 2018/0158978 A1 | 6/2018 | Dobrinsky et al. |
| 2018/0166604 A1 | 6/2018 | Fujita et al. |
| 2018/0248071 A1 | 8/2018 | Jain et al. |

OTHER PUBLICATIONS

Zhang, L, Ding, Yan, Wang, Zeng, Wei, Li, Sun, Duan, and Li, "Three-dimensional hole gas induced by polarization in (0001)-oriented metal-face Ill-nitride structure," Applied Physics Letter, vol. 97, 062130, Aug. 9, 2010, 3 pages.

Hsieh, H. Y., U.S. Appl. No. 16/148,360, Final Office Action 1, dated Mar. 16, 2020, 17 pages.

Hsieh, H. Y., U.S. Appl. No. 16/148,360, Office Action 1, dated Sep. 12, 2019, 14 pages.

\* cited by examiner

SEMICONDUCTOR HETEROSTRUCTURE WITH P-TYPE SUPERLATTICE

REFERENCE TO RELATED APPLICATIONS

The current application is a continuation application of U.S. application Ser. No. 16/148,360, filed on 1 Oct. 2018, which claims the benefit of U.S. Provisional Application No. 62/566,420, filed on 30 Sep. 2017, both of which are hereby incorporated by reference.

TECHNICAL FIELD

The disclosure relates generally to electronic and optoelectronic devices, and more particularly, to group III nitride based electronic and optoelectronic devices.

BACKGROUND ART

Development of group III nitride based electronic and optoelectronic devices with high efficiency and reliability depends on many factors, such as a crystalline quality of the semiconductor layers, active layer design, and contacts quality. In particular, achieving highly conductive p-type gallium nitride (GaN) and/or aluminum gallium nitride (AlGaN) is important for to realize a number of electronic and optoelectronic devices, including light emitting diodes and optoelectronic devices, including light emitting diodes operating in the ultraviolet (UV) range of the optical spectrum (UV LEDs). Achieving a high p-type conductivity of magnesium (Mg)-doped AlGaN has been challenging due to a large acceptor activation energy of more than 150 milli-electron Volts (meV), as well as due to a low hole mobility in heavily Mg-doped AlGaN alloys. The problem is particularly severe with increased molar fraction of aluminum due to a further increase of the acceptor activation energy and also due to an increase in unintentional donor-like defects, which act as compensation centers. For AlGaN layers having high aluminum molar fractions, the oxygen (O) donor concentration can result in insulating or even n-type characteristics of the AlGaN layers despite heavy Mg impurity concentration.

Additionally, heavy Mg doping can negatively affect the reliability of the optoelectronic device. The occurrence of device lifetime degradation beyond device self-heating effects has been previously reported and attributed to the migration of Al atoms from the p-type cladding into the active region.

To further enhance the output power of UV LEDs it is important to improve carrier injection efficiency and achieve higher p-type conductivity. To resolve the first issue, electron blocking layers with Al composition higher than that the active region have been introduced to prevent electron overflow into the LED p-type region. On the other hand, to increase hole concentration, polarization-assisted doping has been demonstrated as an alternative to the conventional thermally-activated hole generation. This alternative method has been implemented using either i) p-type AlGaN superlattice (SL) engineering resulting in the formation of 2 DEG in the well layer of the SPSL, ii) composition-graded Mg-doped AlGaN layer leading to a 3D hole generation, or iii) a combination of both. The same concepts described in i) and ii) were also used for the design of the electron blocking layer.

SUMMARY OF THE INVENTION

Previous inventions/references involved SL structures that are proximate the active region, the electron blocking layer (EBL), or form a transparent EBL. An embodiment of the invention described herein replaces a conventional, relatively thick p-GaN contact layer with a multi-layer structure that comprises an asymmetric superlattice (e.g., a p-type superlattice) proximate a composition graded transition layer and a very thin (e.g., 15 nanometers or less) p-GaN layer. In addition, a reflective (e.g., highly reflective) metal coating can be deposited on top of the thin p-GaN layer to boost the amount of light collected from the transparent substrate side.

Aspects of the invention provide a heterostructure for an optoelectronic device with improved p-type conductivity and/or emitted light intensity. The heterostructure includes an active region including at least one quantum well and at least one barrier and an electron blocking layer located adjacent to the active region, wherein the electron blocking layer includes a region of graded composition. An asymmetric p-type superlattice layer is located adjacent to the electron blocking layer, wherein the p-type superlattice includes at least one superlattice period comprising a set of wells and a set of barriers. A thickness of at least one of: each well in the set of wells or each barrier in the set of barriers varies along a length of the p-type superlattice.

A first aspect of the invention provides a heterostructure comprising: an active region including at least one quantum well and at least one barrier; an electron blocking layer located adjacent to the active region, wherein the electron blocking layer includes a region of graded composition; and an asymmetric p-type superlattice layer located adjacent to the electron blocking layer, wherein the p-type superlattice layer includes at least one superlattice period comprising a plurality of wells and a plurality of barriers, and wherein a thickness of at least one of: each well in the plurality of wells or each barrier in the plurality of barriers varies along a length of the p-type superlattice layer.

A second aspect of the invention provides an optoelectronic device comprising: an n-type contact layer; an active region including at least one quantum well and at least one barrier located adjacent to the n-type contact layer; an electron blocking layer located adjacent to the active region, wherein the electron blocking layer includes a region of graded composition; a p-type superlattice layer located adjacent to the electron blocking layer, wherein the p-type superlattice layer includes at least one superlattice period comprising a plurality of wells and a plurality of barriers, and wherein a thickness of at least one of: each well in the plurality of wells or each barrier in the plurality of barriers varies along a length of the p-type superlattice layer; and a p-type contact layer located adjacent to the p-type superlattice layer, wherein the p-type contact layer has a thickness less than 15 nanometers.

A third aspect of the invention provides an optoelectronic device comprising: a group III nitride n-type contact layer; a group III nitride active region including at least one quantum well and at least one barrier, wherein the active region is located adjacent to the n-type contact layer; a group III nitride electron blocking layer located adjacent to the active region, wherein the electron blocking layer includes a region of graded composition; a group III nitride p-type superlattice layer located adjacent to the electron blocking layer, wherein the p-type superlattice layer includes at least one superlattice period comprising a plurality of wells and a plurality of barriers, and wherein a thickness of at least one of: each well in the plurality of wells or each barrier in the plurality of barriers varies along a length of the p-type superlattice layer; and a group III nitride p-type contact located adjacent to the p-type superlattice layer.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIG. 7A shows a plot of three different p-type superlattices with different average bandgap compositions according to embodiments, while

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Figure 1:
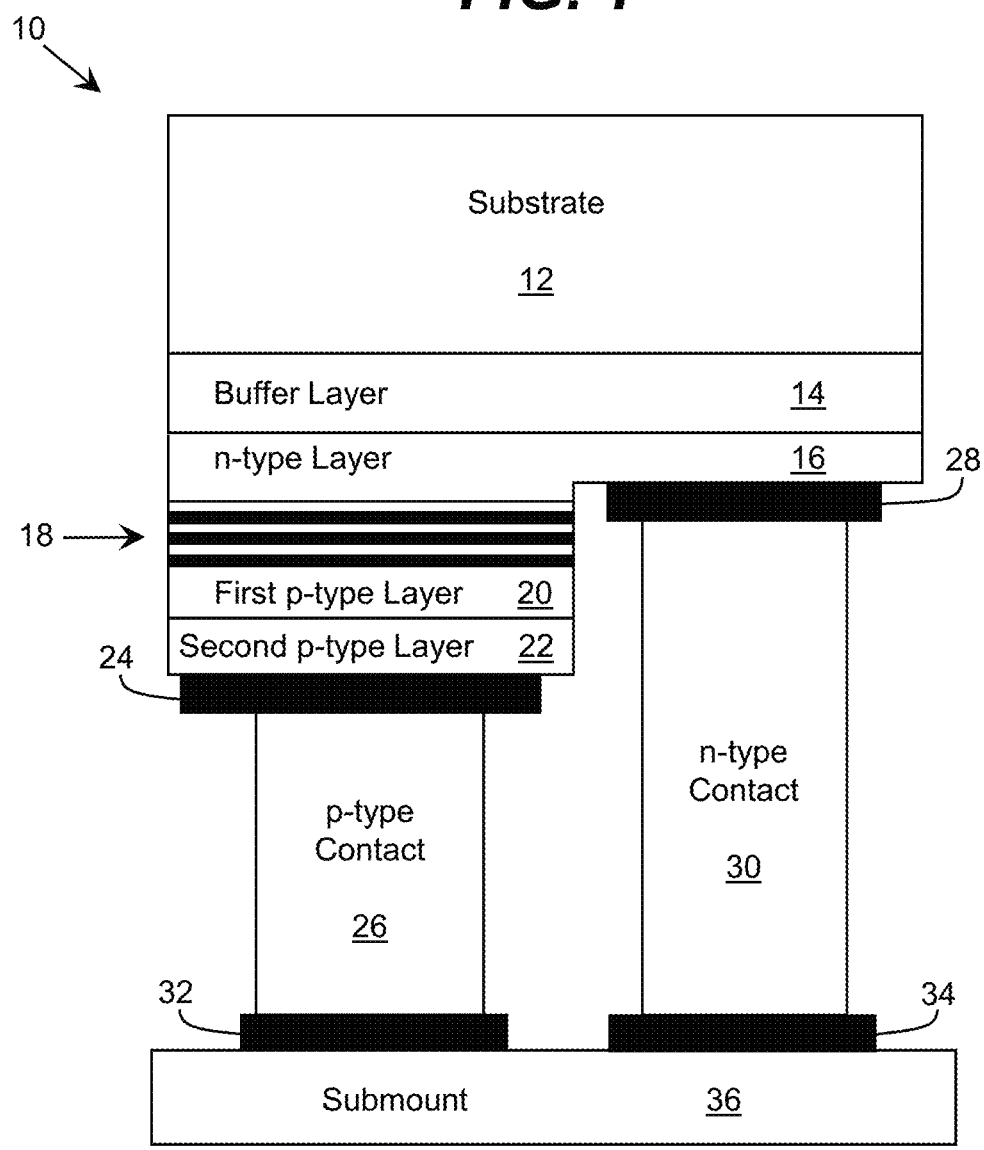
FIG. 1 shows a schematic of an illustrative optoelectronic device having a semiconductor heterostructure according to an embodiment.

As indicated above, aspects of the invention provide a heterostructure for an optoelectronic device with improved p-type conductivity and/or emitted light intensity. The heterostructure includes an active region including at least one quantum well and at least one barrier and an electron blocking layer located adjacent to the active region, wherein the electron blocking layer includes a region of graded composition. An asymmetric p-type superlattice layer is located adjacent to the electron blocking layer, wherein the p-type superlattice includes at least one superlattice period comprising a set of wells and a set of barriers. A thickness of at least one of: each well in the set of wells or each barrier in the set of barriers varies along a length of the p-type superlattice.

It is understood that, unless otherwise specified, each value is approximate and each range of values included herein is inclusive of the end values defining the range. As used herein, unless otherwise noted, the term "approximately" is inclusive of values within +/−ten percent of the stated value, while the term "substantially" is inclusive of values within +/−five percent of the stated value. Unless otherwise stated, two values are "similar" when the smaller value is within +/−twenty-five percent of the larger value. A value, y, is on the order of a stated value, x, when the value y satisfies the formula $0.1x \leq y \leq 10x$.

As used herein, unless otherwise noted, the term "set" means one or more (i.e., at least one) and the phrase "any solution" means any now known or later developed solution. As used herein, two materials have comparable compositions when the molar fractions of the corresponding materials differ by at most ten percent (five percent in a more specific embodiment). For example, considering two group III nitride materials, $Al_xIn_yB_zGa_{1-x-y-z}N$ and $Al_{x'}In_{y'}B_{z'}Ga_{1-x'-y'-z'}N$, the two materials have comparable compositions when each of the molar fractions x, y, and z differs from the corresponding molar fractions x', y', and z' by less than ten percent, where the percentage is calculated by taking a difference between the molar fractions and dividing the value by the higher molar fraction. Similarly, two layers have comparable thicknesses when the corresponding thicknesses differ by at most ten percent (five percent in a more specific embodiment). Unless otherwise specified, two layers have similar thicknesses when the respective thicknesses are within one nanometer (inclusive) of each other. Similarly, two layers have different thicknesses when the thicknesses differ by more than one nanometer. It is understood that two numbers are on the same order as one another when a ratio of the higher number to the lower number is less than ten.

Compositions of two semiconductor layers also can be evaluated in conjunction with the corresponding band gaps. In this case, as used herein, compositions of two semiconductor layers are the same when the band gaps of the two semiconductor layers differ by less than the thermal energy unit, kT. The compositions of two semiconductor layers are substantially the same when the band gaps of the two semiconductor layers differ by less than three times the thermal energy unit, 3 kT. A composition of a first semiconductor layer is considered larger than a composition of a second semiconductor layer when the band gap of the first semiconductor layer is larger than the band gap of the second semiconductor layer by more than the thermal energy unit, kT. A composition of a first semiconductor layer is considered substantially larger than a composition of a second semiconductor layer when the band gap of the first semiconductor layer is larger than the band gap of the second semiconductor layer by more than three times the thermal energy unit, 3 kT. Unless otherwise specified, the thermal energy unit is approximated as 0.026 eV.

Aspects of the invention provide a heterostructure that can be incorporated into an optoelectronic device, such as a conventional or super luminescent light emitting diode (LED), a light emitting laser, a laser diode, a light sensor, a photodetector, a photodiode, an avalanche diode, and/or the like. Turning to the drawings, FIG. 1 shows a schematic structure of an optoelectronic device 10 according to an embodiment. In a more particular embodiment, the optoelectronic device 10 is configured to operate as an emitting device, such as a light emitting diode (LED). In this case, during operation of the optoelectronic device 10, application of a bias comparable to the band gap results in the emission of electromagnetic radiation from an active region 18 of the optoelectronic device 10. The electromagnetic radiation emitted by the optoelectronic device 10 can have a peak wavelength within any range of wavelengths, including visible light, ultraviolet radiation, deep ultraviolet radiation, infrared light, and/or the like. In an embodiment, the device 10 is configured to emit radiation having a dominant wavelength within the ultraviolet range of wavelengths. In a more particular embodiment, the device 10 is configured to emit radiation having a dominant wavelength less than or equal to approximately 320 nanometers.

The optoelectronic device 10 includes a heterostructure comprising a substrate 12, a buffer layer 14 adjacent to the substrate 12, an n-type layer 16 (e.g., a cladding layer, electron supply layer, contact layer, and/or the like) adjacent to the buffer layer 14, and an active region 18 (e.g., a multiple quantum well active region) adjacent to the n-type layer 16. Furthermore, the heterostructure of the optoelectronic device 10 includes a first p-type layer 20 (e.g., an electron blocking layer) adjacent to the active region 18 and a second p-type layer 22 (e.g., a cladding layer, hole supply layer, contact layer, and/or the like) adjacent to the first p-type layer 20. While the device 10 is shown including two p-type layers 20, 22 and a single n-type layer 16, it is understood that embodiments of the optoelectronic device 10 can include additional p-type and/or n-type layers.

In a more particular illustrative embodiment, the optoelectronic device 10 is a group III-V materials based device, in which some or all of the various layers are formed of elements selected from the group III-V materials system. In a still more particular illustrative embodiment, the various layers of the optoelectronic device 10 are formed of group III nitride based materials. Group III nitride materials comprise one or more group III elements (e.g., boron (B), aluminum (Al), gallium (Ga), and indium (In)) and nitrogen (N), such that $B_W Al_X Ga_Y In_Z N$, where $0 \leq W, X, Y, Z \leq 1$, and $W+X+Y+Z=1$. Illustrative group III nitride materials include binary, ternary and quaternary alloys such as, AlN, GaN, InN, BN, AlGaN, AlInN, AlBN, AlGaInN, AlGaBN, AlInBN, and AlGaInBN with any molar fraction of group III elements.

An illustrative embodiment of a group III nitride based optoelectronic device 10 includes an active region 18 (e.g., a series of alternating quantum wells and barriers) composed of $In_y Al_x Ga_{1-x-y} N$, $Ga_z In_y Al_x B_{1-x-y-z} N$, an $Al_x Ga_{1-x} N$ semiconductor alloy, or the like. Similarly, both the n-type cladding layer 16 and the first p-type layer 20 can be composed of an $In_y Al_x Ga_{1-x-y} N$ alloy, a $Ga_z In_y Al_x B_{1-x-y-z} N$ alloy, or the like. The molar fractions given by x, y, and z can vary between the various layers 16, 18, and 20. The substrate 12 can be sapphire, silicon carbide (SiC), silicon (Si), GaN, AlGaN, AlON, $LiGaO_2$, or another suitable material, and the buffer layer 14 can be composed of AlN, an AlGaN/AlN superlattice, and/or the like. While further details of various layers are described in conjunction with AlGaN materials, it is understood that this material is only illustrative of various materials. To this extent, it is understood that embodiments of such layers also can comprise group III nitride materials including boron and/or indium. Additionally, other embodiments can include materials other than group III nitride materials, such as other group III-V materials.

As shown with respect to the optoelectronic device 10, a p-type metal 24 can be attached to the second p-type layer 22 and a p-type contact (electrode) 26 can be attached to the p-type metal 24. Similarly, an n-type metal 28 can be attached to the n-type layer 16 and an n-type contact (electrode) 30 can be attached to the n-type metal 28. The p-type metal 24 and the n-type metal 28 can form ohmic contacts to the corresponding layers 22, 16, respectively. In an embodiment, the p-type metal 24 and the n-type metal 28 each comprise several conductive and reflective metal layers, while the n-type contact 30 and the p-type contact 26 each comprise highly conductive metal. In an embodiment, the second p-type layer 22 and/or the p-type contact 26 can be transparent (e.g., semi-transparent or transparent) to the electromagnetic radiation generated by the active region 18. Furthermore, the p-type contact 26 and/or the n-type contact 30 can be reflective of the electromagnetic radiation generated by the active region 18. In another embodiment, the n-type layer 16 can be formed of a short period superlattice, such as an AlGaN SPSL, which is transparent to the electromagnetic radiation generated by the active region 18.

As used herein, a layer is a transparent layer when the layer allows at least ten percent of radiation having a target wavelength, which is radiated at a normal incidence to an interface of the layer, to pass there through. Furthermore, as used herein, a layer is a reflective layer when the layer reflects at least ten percent of radiation having a target wavelength, which is radiated at a normal incidence to an interface of the layer. In an embodiment, the target wavelength of the radiation corresponds to a wavelength of radiation emitted or sensed (e.g., peak wavelength+/−five nanometers) by the active region 18 during operation of the device 10. For a given layer, the wavelength can be measured in a material of consideration and can depend on a refractive index of the material.

As further shown with respect to the optoelectronic device 10, the device 10 can be mounted to a submount 36 via the contacts 26, 30 in a flip chip configuration. In this case, the substrate 12 is located on the top of the optoelectronic device 10. To this extent, the p-type contact 26 and the n-type contact 30 can both be attached to a submount 36 via contact pads 32, 34, respectively. The submount 36 can be formed of aluminum nitride (AlN), silicon carbide (SiC), silicon, and/or the like.

Any of the various layers of the optoelectronic device 10 can comprise a substantially uniform composition or a graded composition. For example, a layer can comprise a graded composition at a heterointerface with another layer. In an embodiment, the first p-type layer 20 comprises a p-type electron blocking layer having a graded composition. The graded composition(s) can be included to, for example, reduce stress, improve carrier injection, and/or the like. Similarly, a layer can comprise a superlattice including a plurality of periods, which can be configured to reduce stress, and/or the like. In this case, the composition and/or width of each period can vary periodically or aperiodically from period to period.

It is understood that the layer configuration of the optoelectronic device 10 described herein is only illustrative. To this extent, a heterostructure for an optoelectronic device can include an alternative layer configuration, one or more additional layers, and/or the like. As a result, while the various layers are shown immediately adjacent to one another (e.g., contacting one another), it is understood that one or more intermediate layers can be present in a heterostructure for an optoelectronic device. For example, an illustrative heterostructure for an optoelectronic device can include an undoped layer between the active region 18 and one or both of the second p-type layer 22 and the n-type layer 16.

Furthermore, a heterostructure for an optoelectronic device can include a Distributive Bragg Reflector (DBR) structure, which can be configured to reflect light of particular wavelength(s), such as those emitted by the active region 18, thereby enhancing the output power of the device/heterostructure. For example, the DBR structure can be located between the second p-type layer 22 and the active region 18. Similarly, a heterostructure for an optoelectronic device can include a p-type layer 20 located between the second p-type layer 22 and the active region 18. The DBR structure and/or the p-type layer 20 can have any composition selected based on a desired wavelength of the light generated by the device. In one embodiment, the DBR structure has a Mg, Mn, Be, or Mg+Si-doped p-type composition. The p-type layer 20 can have a p-type AlGaN, AlInGaN, and/or the like. It is understood that a heterostructure for an optoelectronic device can include both the DBR structure and the p-type layer 20 (which can be located between the DBR structure and the second p-type layer 22) or can include only one of the DBR structure or the p-type layer 20. In an embodiment, the p-type layer 20 can be included in the device/heterostructure in place of an electron blocking layer. In another embodiment, the p-type layer 20 can be included between the second p-type layer 22 and the electron blocking layer.

Additional aspects of the invention are discussed in conjunction with a group III nitride heterostructure. In particular, adjustment of aluminum content within layers of the group III nitride heterostructure is used to illustrate aspects of the invention. However, it is understood that this is only illustrative, and the invention can be applied to various types of materials and elements in the materials. Similarly, while aspects of the invention are shown and described in conjunction with the p-type side of an active region, it is understood that embodiments of the invention can be applied to the design and configuration of one or more layers located on the n-type side of the active region and/or the active region itself.

Figure 2A:
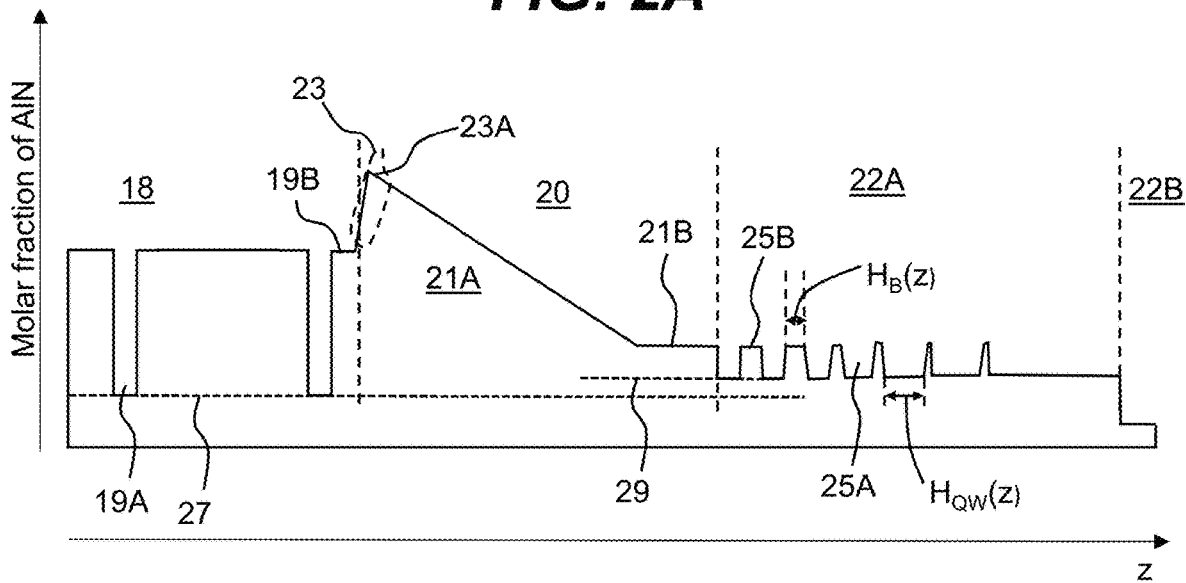
FIGS. 2A and 2B show composition profiles of a portion of illustrative heterostructures according to embodiments.
Figure 2B:
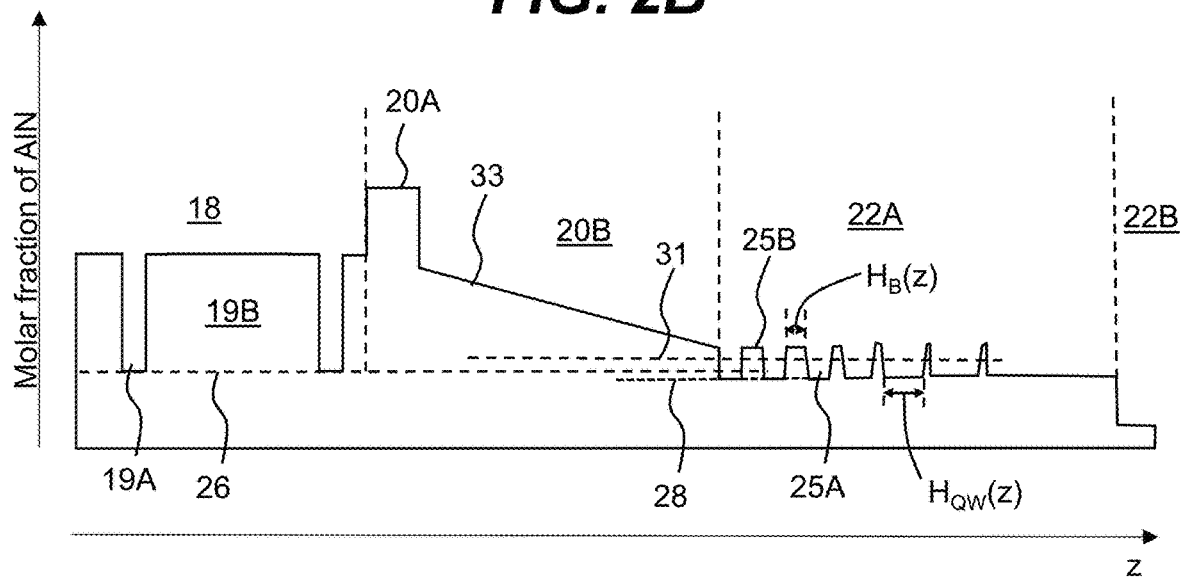

Turning now to FIGS. 2A and 2B, illustrative composition profiles of a portion of a group III nitride heterostructure for an optoelectronic device, such as the optoelectronic device 10 shown in FIG. 1, according to embodiments is shown. As shown in FIG. 2A, the heterostructure includes an active region 18, an electron blocking layer 20, and a p-type layer 22 including an asymmetric p-type superlattice layer 22A, and a p-type GaN layer 22B. These composition profiles show the molar ratio of AlN as a function of device thickness. It is understood that portions of the heterostructure are not shown, such as the substrate 12, buffer layer 14, and n-type layer 16 (FIG. 1). It is understood that the buffer layer 14 can be epitaxially grown and comprise an AlN layer, a AlGaN/AlN superlattice, and/or the like. In an embodiment, the n-type layer 16 can comprise an n-type doped AlGaN layer that is epitaxially grown over the buffer layer 14. In another embodiment, the n-type layer 16 can comprise a variable AlN molar ratio and can have a complex layered structure that includes a $Al_xGa_{1-x}N/Al_yGa_{1-y}N$ superlattice, interlayers having different composition than the overall AlGaN n-type layer, wherein the difference in the AlN molar ratio between the interlayers is at least 5%. In an embodiment, the thickness of the interlayers can be in a range between 2 atomic layers and 20 nanometers, and is selected to manage compressive and tensile stresses within the AlGaN n-type layer 16.

In an embodiment, the active region 18 is a series of alternating quantum wells 19A and barriers 19B. The bandgap of the quantum wells 19A are chosen to be narrower than the bandgap for the barriers 19B. Therefore, the molar ratio of AlN in the quantum wells 19A is lower than the molar ratio of AlN in the barriers 19B, as seen in FIGS. 2A and 2B. The thickness of the quantum wells 19A is chosen for an appropriate carrier localization and can comprise several nanometers. The barriers 19B can be wider than the quantum wells 19B and comprise several quantum well thicknesses.

The electron blocking layer 20 is located adjacent to the active region 18. In an embodiment, as shown in FIG. 2A, a barrier 19B of the active region 18 is located adjacent to the electron blocking layer 20. In an embodiment, the last barrier 19B can have a different thickness and/or different composition than the other barriers 19B in the active region 18. For example, in FIG. 2A, the thickness of the last barrier 19B is thinner than other barriers 19B in the active region 18. However, it is understood that the electron blocking layer 20 can be located immediately adjacent to the last quantum well 19A of the active region 18. In an embodiment, the electron blocking layer 20 can comprise a first layer 21A and a second layer 21B. Although only two layers are shown, it is understood that the electron blocking layer 20 can comprise a multilayered structure with more than two layers. In an embodiment, the layers of the electron blocking layer 20 do not contain any discontinuities.

The interface 23 between the last barrier 19B of the active region 18 and the electron blocking layer 20 can be graded to a maximum molar ratio of AlN 23A for the electron blocking layer 20. In an embodiment the maximum molar ratio of AlN 23A within the electron blocking layer 20 can be in the range of 0.9 to 1.0. However, it is understood that this is only illustrative. For example, in an alternative embodiment, the electron blocking layer 20 can include a grading at the interface that starts at the maximum molar ratio of AlN 23A and decreases with distance from the active region 18. The molar ratio of AlN in the first layer 21A of the electron blocking layer can be graded and decrease from the maximum molar ratio of AlN 23A to the molar ratio of AlN for the second layer 21B of the electron blocking layer 20. The thickness and molar ratio grading of the first layer 21A is selected to result in p-type polarization doping having a magnitude within 50% of the doping in the p-type superlattice 22. In an embodiment, the thicknesses of each of the layers 21A, 21B of the electron blocking layer 20 is in the range of a few tens (e.g., 20) to a few hundreds (e.g., 300) nanometers. While the graded layer 21A is shown as having a thickness larger than that of the layer 21B, it is understood that this is only illustrative and the layers can have any relative thickness. In an embodiment, the molar ratio of AlN for the second layer 21B can be constant. In an embodiment, the AlN molar ratio of the second layer 21B can be higher than the AlN molar ratio of the barriers of an asymmetric p-type superlattice layer 22A, which is located adjacent to the electron blocking layer 20.

The p-type superlattice layer 22A is formed of at least one superlattice period comprising a stack of alternate wells 25A (e.g., quantum wells) and barriers 25B. In an embodiment, at least one of the wells 25A and/or the barriers 25B within each period have varied thicknesses. The thickness(es) can be selected such that an average bandgap of each period changes within the superlattice layer 22A. The p-type superlattice layer 22A is shown including a single superlattice period. However, it is understood that the periodic (or fundamental) stack of nitride materials can be repeated one or more times. The thickness of the wells 25A is shown as $H_{QW}(z)$, where z is the growth direction. In an embodiment, the thickness of the wells 25A increases along the growth direction z towards a thin p-type contact layer 22B. In an embodiment, the p-type superlattice layer 22A is configured to result in absorption of the light emitted by the active region 18 that is less than approximately sixty percent. The thickness of the p-type superlattice layer 22A can be in the range between few tens to few hundreds of nanometers (e.g., 20-300 nanometers). In an embodiment, the thickness of the p-type superlattice layer 22A does not exceed 500 nanometers. In an embodiment, the p-type contact layer 22B has a thickness less than or equal to approximately 15 nanometers.

The thickness of the barriers 25B is shown as $H_B(z)$, where, again, z is the growth direction. In an embodiment, the thickness of the barriers 25B decreases along the growth direction z towards the p-type contact. The varying thickness of the barriers 25B can create a compositionally graded asymmetric short period superlattice. For example, the bandgap of the SPSL can decrease with each period of the SL structure versus the distance from the layer 21B. Such a graded composition SL can exhibit good conductivity while also being transparent to the emission wavelength from the active region 18, which can improve the device emitted light intensity.

It is understood that this is only one embodiment of varying the thicknesses of the wells 25A and barriers 25B and that other variations in thicknesses can be used to increase the p-type conductivity of the device. In an embodiment, experimental testing can be used to determine the thickness variation for the wells 25A and the barriers 25B. In an embodiment, only one of the wells 25A or the barriers 25B can include variations of thicknesses. In an embodiment, each layer (e.g., the wells 25A and the barriers 25B) within the p-type superlattice 22 is between a few atomic layers to a few nanometers. The total thickness of the superlattice and thicknesses of the wells 25A and the barriers 25B also can be designed to reduce an electrical resistance in the growth direction and/or allow hole transport by tunneling.

As seen in FIG. 2A, in an embodiment, the molar ratio of AlN 28 of the wells 25A within the p-type superlattice 22A can be higher than the molar ratio of AlN 26 of the quantum wells 19A within the active region 18. Turning now to FIG. 2B, in another embodiment, the molar ratio of AlN 28 of the wells 25A within the p-type superlattice 22A can be lower than the molar ratio of AlN 26 of the quantum wells 19A within the active region 18, while the average molar ratio of AlN 30 of the p-type superlattice 22A is higher than the molar ratio of AlN 26 of the quantum wells 19A within the active region 18. The average molar ratio of AlN 30 of the p-type superlattice 22A is obtained by averaging the composition of the wells 25A and the barriers 25B of the p-type superlattice 22A, weighted by the overall thickness of the wells 25A and the barriers 25B. FIG. 2B also shows an electron blocking layer that includes a region of constant composition 20A and a second region 20B that is graded 32 and continuously decreases from a molar ratio of aluminum approximately equal to that of the barriers 19B in the active region 18 to a molar ratio approximately equal to that of the barriers 25B in the p-type superlattice 22A.

In an embodiment, a thin p-type contact layer 22B can be located adjacent to the p-type superlattice 22A. The p-type contact layer 22B can comprise an epitaxially grown group III nitride semiconductor and p-type doping. In an embodiment, the p-type contact layer 22B can include a large p-type dopant concentration that exceeds $10^{18}$ dopants per $cm^2$. In an embodiment, the p-type contact layer 22B comprises GaN, such as in a heterostructure used to fabricate a UV LED. The thickness of the p-type contact layer 22B is selected to result in absorption of a target wavelength (e.g., the radiation emitted by the active region 18) of less than 50%. In an embodiment, the p-type contact layer 22B has a thickness less than or equal to approximately 15 nanometers.

As discussed herein, a p-type metal 24 (FIG. 1) can be formed adjacent to the p-type contact layer 22B. The p-type metal 24 can be configured to form an ohmic contact to the p-type contact layer 22B. In an embodiment, the p-type metal 24 is configured to reflect light emitted by the active region 18 which has transmitted through the various p-type layers. In an embodiment, the p-type metal 24 comprises a stack of metals including one or more layers formed of at least one of: Ag, Al, Pd, Ti, Au and Ni.

Figure 3:
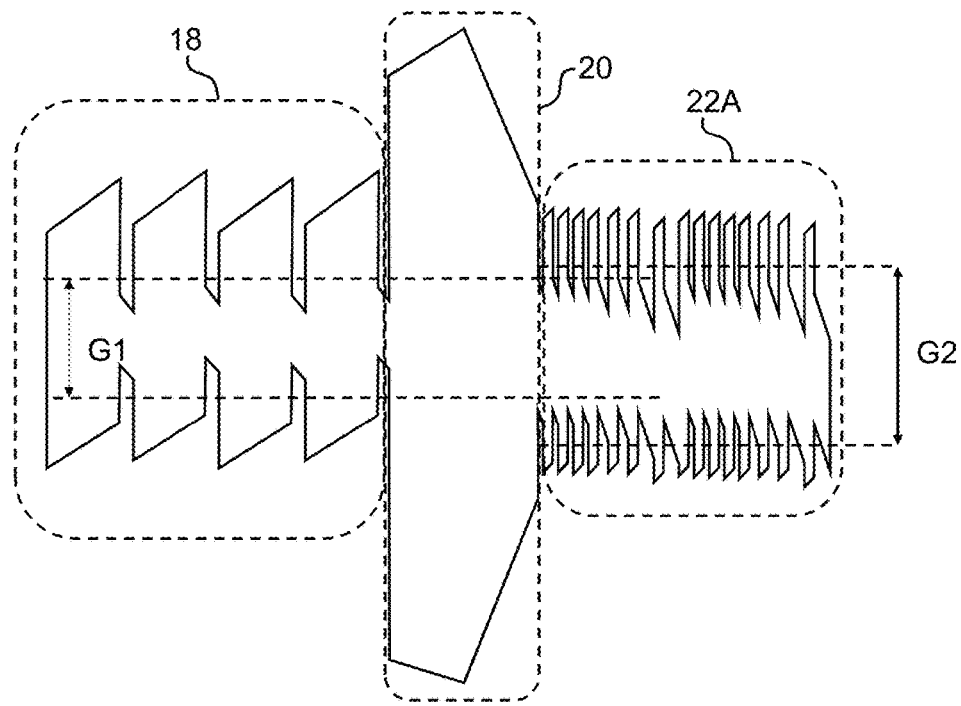
FIG. 3 shows a band diagram of an illustrative heterostructure according to an embodiment.

Turning now to FIG. 3, a band diagram of a portion of an illustrative optoelectronic device according to an embodiment is shown. The band diagram shows embodiments of the active region 18, the electron blocking layer 20, and the p-type superlattice 22A. In an embodiment, the device operates at a wavelength of emission corresponding to the energy separation G1 of the energy levels within the quantum wells (e.g., quantum wells 19A in FIGS. 2A and 2B) of the active region 18. The average bandgap G2 of the p-type superlattice 22A is selected to ensure that the p-type superlattice 22A is sufficiently transparent (e.g., a transmission of at least twenty percent) to the light emitted (absorbed) from the active region 18 with energy G1. In an embodiment, the average bandgap G2 exceeds the energy separation G1. In an embodiment, the energy G2 corresponds to the minimum value of average bandgaps computed over each period of the p-type superlattice 22A, wherein each period includes one barrier and one well. As mentioned herein, the thicknesses of either the wells or the barriers, or both, (see, e.g., FIGS. 2A and 2B) can vary. The thicknesses of the wells and/or barriers within the p-type superlattice 22A can range from a few angstroms to a few nanometers, and, in some cases, be on the order of 10 nanometers.

In an embodiment, the bandgap of both the electron blocking layer 20 and the barriers within the p-type superlattice 22A is wider than the bandgap of the quantum wells within the active layer 18. In an embodiment, the bandgap of both the electron blocking layer 20 and the barriers within the p-type superlattice 22A is wider than the photon energy corresponding to the target radiation. In an embodiment, the average bandgap over the p-type superlattice 22A is wider than the bandgap of the quantum wells within the active region 18. In an embodiment, the average bandgap over the p-type superlattice is wider than the photon energy corresponding to the target radiation. In an embodiment, the average bandgap of each period within the p-type superlattice is wider than the photon energy corresponding to the target radiation.

Figure 4:
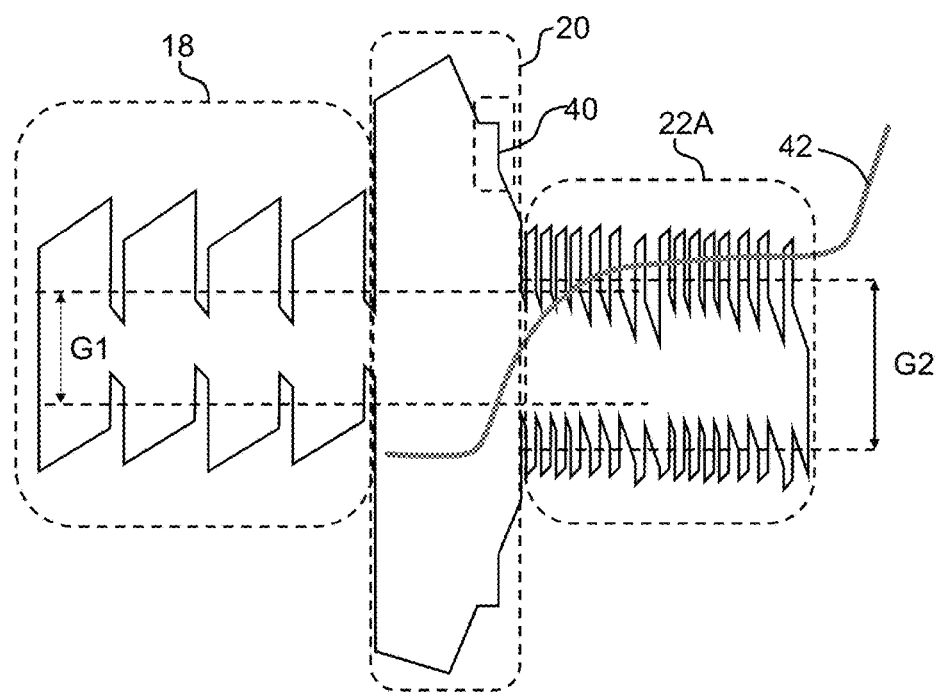
FIG. 4 shows a band diagram of another illustrative heterostructure according to an embodiment.

Turning now to FIG. 4, a band diagram of a portion of an illustrative optoelectronic heterostructure/device according to an embodiment is shown. Similar to the band diagram shown in FIG. 3, the band diagram shows illustrative embodiment of an active region 18, an electron blocking layer 20, and a p-type superlattice 22A. However, the electron blocking layer 20 includes a more complex structure, with a region 40 of constant composition between the graded regions. In an embodiment, the device can include a variable p-type doping profile 42, where the p-type doping is lower within the electron blocking layer 20 and increases towards the p-type superlattice 22A and continues to increase in the p-type contact layer 22B (FIGS. 2A and 2B) adjacent to the p-type superlattice 22A. In an embodiment, the p-type doping in the electron blocking layer 20 is an order of magnitude smaller than the p-type doping in the p-type superlattice 22A. In an embodiment, the aluminum composition grading within the electron blocking layer 20 can be implemented over a thickness of the electron blocking layer 20 to result in polarization doping that is on the order of magnitude of the p-type doping of the p-type superlattice layer 22A. As illustrated, the doping profile 42 can significantly increase after the p-type superlattice layer 22A in a region corresponding to the p-type contact layer 22B.

Figure 5:
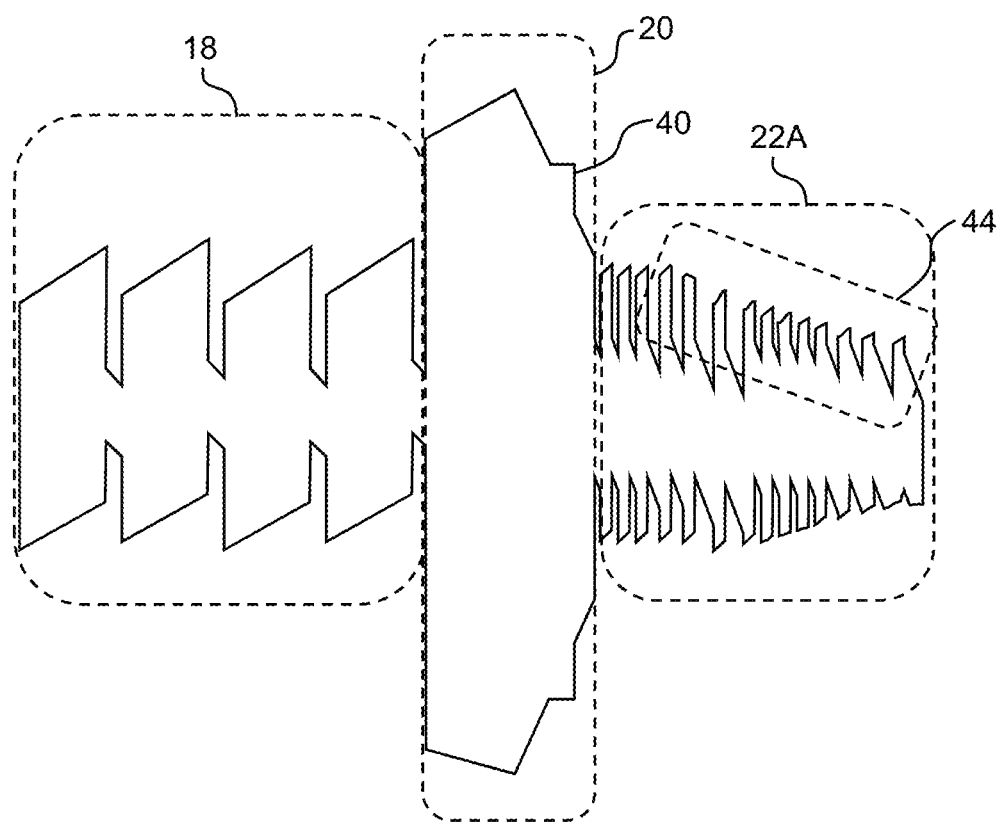
FIG. 5 shows a band diagram of still another illustrative heterostructure according to an embodiment.

Turning now to FIG. 5, a band diagram of a portion of an illustrative optoelectronic heterostructure/device according to an embodiment is shown. Similar to the band diagrams shown in FIGS. 3 and 4, the band diagram shows illustrative embodiments of an active region 18, an electron blocking layer 20, and a p-type superlattice 22A. The electron blocking layer 20 includes a similar structure to the electron blocking layer 20 in FIG. 4. However, the p-type superlattice 22A can include barriers that have a composition that is different from the previous barrier. For example, FIG. 5 shows a gradual decrease of the bandgap for the p-type superlattice 22A away from the electron blocking layer 20. In this embodiment, the molar ratio of AlN for the barriers can decrease away from the electron blocking layer 20 (towards the p-type contact layer 22 shown in FIGS. 2A and 2B). It is understood that the change in composition for the barriers can be combined with an independent change in composition for the wells within the p-type superlattice. In an embodiment, the composition for the wells can also decrease away from the electron blocking layer 20. In another embodiment, both the composition and the thicknesses of the barriers and wells can be varied as a function of the thickness of the p-type superlattice layer 22A.

Figure 6A:
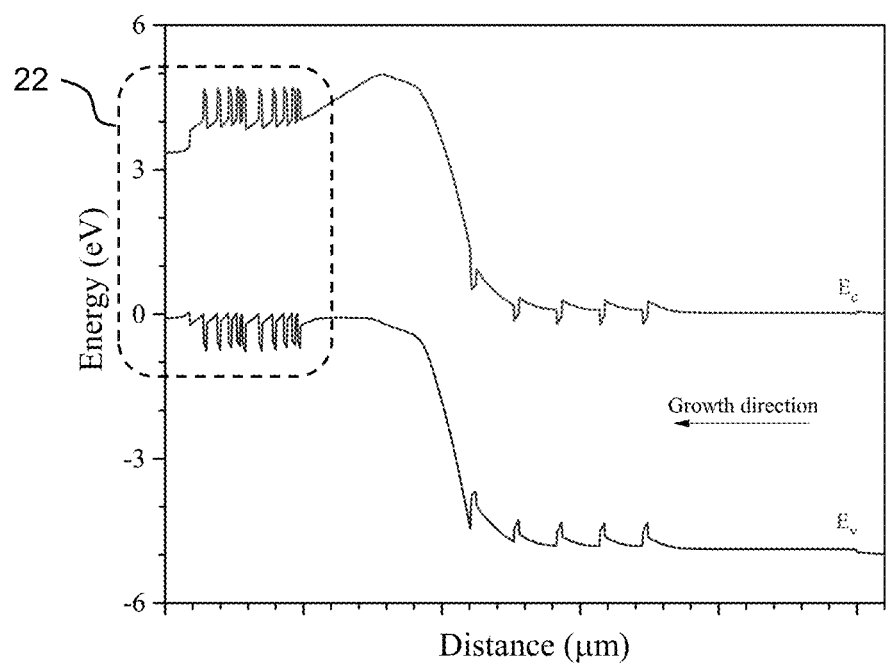
FIGS. 6A and 6B show a typical simulated bandgap profile of a device comprising an illustrative heterostructure according to an embodiment.
Figure 6B:
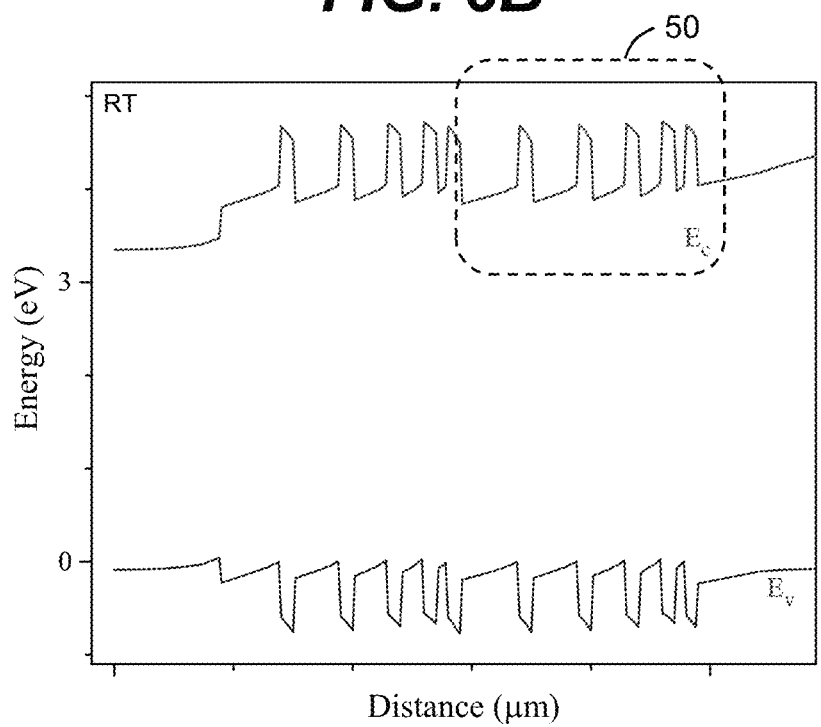

Turning now to FIGS. 6A and 6B, a typical simulated bandgap profile of a portion of a device comprising a heterostructure described herein according to an embodiment is shown. As seen in FIG. 6A, the heterostructure comprises a multiple quantum well active region positioned between n-type and p-type regions. The heterostructure exhibits a large energy drop around the electron blocking layer. A zoomed in view of the p-type superlattice 22A and p-type contact layer 22B (collectively referenced as 22) is shown in FIG. 6B, which shows a variation 50 in the thickness of the wells within the p-type superlattice 22A.

Figure 7A:
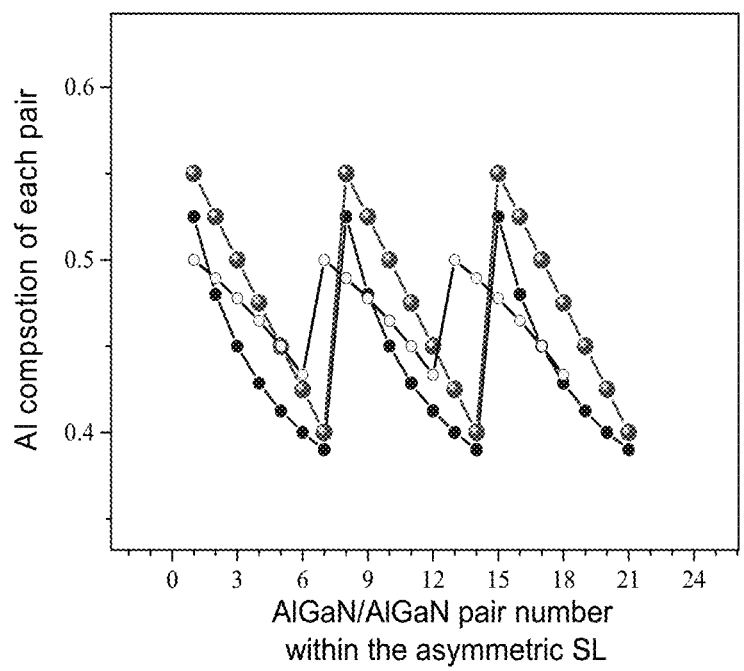

Turning now to FIG. 7A, three different p-type superlattices with different average bandgap compositions are shown. The asymmetric p-type superlattice layer comprises a group III nitride semiconductor having a periodic stack of alternate AlGaN barriers and AlGaN wells with at least one of the barriers and/or wells within each period having a varying thickness. The thickness(es) can be selected such that the average bandgap of each period changes within the superlattice. As illustrated, an embodiment of the asymmetric p-type superlattice layer can include multiple sub-superlattice periods. To this extent, each sub-superlattice period can correspond to a fundamental stack of alternate barriers and wells (e.g., a sub-superlattice structure). The sub-superlattice period can be repeated multiple times (e.g., three repetitions are shown in FIG. 7A). However, it is understood that the periodic (or fundamental) stack of nitride materials in the superlattice can be repeated N times, where N≥1. In an embodiment, each sub-superlattice can be configured such that a bandgap energy decreases along a length of the sub-superlattice in a direction away from the electron blocking layer. The change in bandgap energy can be linear, piecewise linear, monotonic, and/or the like. As illustrated, each sub-superlattice in the p-type superlattice layer can have substantially similar composition as the other sub-superlattices in the p-type superlattice layer. In an alternative embodiment, the sub-superlattices can be similar, but have differing compositions.

Figure 7B:
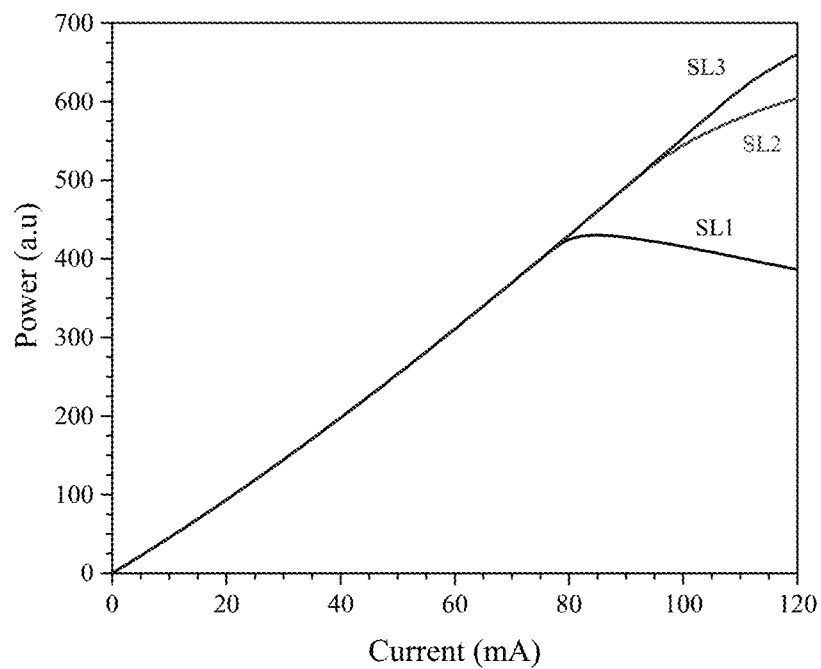
FIG. 7B shows a plot of the power output of devices including three different p-type superlattices.

In FIG. 7B, a plot of the simulated power output of three devices including different designs of the p-type superlattice according to embodiments is shown. SL1 & SL2 refer to two symmetric AlGaN/GaN and AlGaN/AlGaN p-type superlattices, respectively, whereas SL3 is an embodiment of the proposed asymmetric p-type superlattice layer having a varying barrier thickness. It is clear from the plot that the proposed asymmetric p-type superlattice layer can improve device power output at high current injection, which is important for the fabrication of large area, high power light emitting devices.

Figure 8:
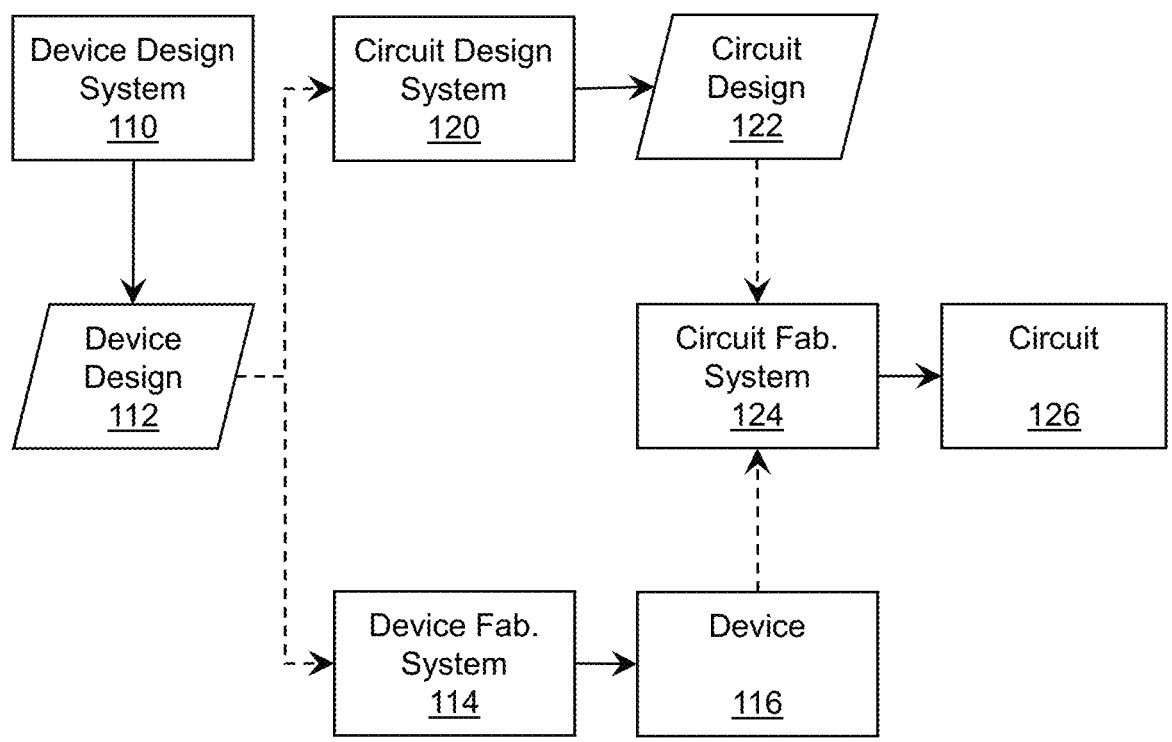
FIG. 8 shows an illustrative flow diagram for fabricating a semiconductor heterostructure having a p-type superlattice according to one of the various embodiments described herein.

In one embodiment, the invention provides a method of designing and/or fabricating a circuit that includes one or more of the devices designed and fabricated as described herein. To this extent, FIG. 8 shows an illustrative flow diagram for fabricating a circuit 126 according to an embodiment. Initially, a user can utilize a device design system 110 to generate a device design 112 for a semiconductor device as described herein. The device design 112 can comprise program code, which can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122 (e.g., by connecting one or more inputs and outputs to various devices included in a circuit). The circuit design 122 can comprise program code that includes a device designed as described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed as described herein.

In another embodiment, the invention provides a device design system 110 for designing and/or a device fabrication system 114 for fabricating a semiconductor device 116 as described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated as described herein. In this case, the system 120, 124 can comprise a general purpose computing device, which is programmed to implement a method of designing and/or fabricating the circuit 126 including at least one semiconductor device 116 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

While illustrative aspects of the invention have been shown and described herein primarily in conjunction with a heterostructure for an optoelectronic device and a method of fabricating such a heterostructure and/or device, it is understood that aspects of the invention further provide various alternative embodiments.

As used herein, unless otherwise noted, the term "set" means one or more (i.e., at least one) and the phrase "any solution" means any now known or later developed solution. The singular forms "a," "an," and "the" include the plural forms as well, unless the context clearly indicates otherwise. Additionally, the terms "comprises," "includes," "has," and related forms of each, when used in this specification, specify the presence of stated features, but do not preclude the presence or addition of one or more other features and/or groups thereof.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A heterostructure comprising:
an active region including at least one quantum well and at least one barrier;
an electron blocking layer located adjacent to the active region, wherein the electron blocking layer includes a region of graded composition formed by a composition having an aluminum nitride molar fraction that continuously increases or continuously decreases with distance from the active region; and
a p-type superlattice layer located adjacent to the electron blocking layer, wherein the p-type superlattice layer includes at least one well and at least one barrier, wherein an aluminum nitride molar fraction of each of the at least one well and each of the at least one barrier in the p-type superlattice layer is lower than an average aluminum nitride molar fraction of the region of graded composition in the electron blocking layer;
a p-type contact layer located adjacent to the p-type superlattice layer.

2. The heterostructure of claim 1, wherein the electron blocking layer includes a region of constant composition adjacent to the region of graded composition.

3. The heterostructure of claim 1, wherein the electron blocking layer includes a second region of graded composition, wherein the second region of graded composition differs from the region of graded composition by at least one of: a rate of grading or a direction of grading.

4. The heterostructure of claim 1, wherein the p-type superlattice layer comprises at least one superlattice period comprising a plurality of wells and a plurality of barriers, and wherein the thickness of each well in the plurality of wells in the at least one superlattice period increases along the length of the p-type superlattice layer and away from the electron blocking layer.

5. The heterostructure of claim 1, wherein the p-type superlattice layer comprises at least one superlattice period comprising a plurality of wells and a plurality of barriers, and wherein the thickness of each barrier in the plurality of barriers in the at least one superlattice period decreases along the length of the p-type superlattice layer and away from the electron blocking layer.

6. The heterostructure of claim 1, wherein the p-type contact layer has a thickness less than 15 nanometers.

7. The heterostructure of claim 1, wherein the p-type superlattice layer comprises at least one superlattice period comprising a plurality of wells and a plurality of barriers, and wherein a bandgap energy decreases in a direction away from the electron blocking layer in the at least one superlattice period.

8. The heterostructure of claim 1, wherein a p-type dopant concentration in the p-type contact layer is higher than a p-type dopant concentration in the p-type superlattice layer.

9. The heterostructure of claim 1, wherein an aluminum nitride molar fraction of the at least one well in the p-type superlattice layer is higher than an aluminum nitride molar fraction of the at least one quantum well in the active region.

10. The heterostructure of claim 1, wherein an average bandgap of each barrier and well pair of the p-type superlattice layer is larger than an average bandgap of the active region.

11. An optoelectronic device comprising:
an n-type layer;
an active region including at least one quantum well and at least one barrier located adjacent to the n-type layer;
an electron blocking layer located adjacent to the active region, wherein the electron blocking layer includes a region of graded composition formed by a composition having an aluminum nitride molar fraction that continuously increases or continuously decreases with distance from the active region;
a p-type superlattice layer located adjacent to the electron blocking layer, wherein the p-type superlattice layer includes at least one well and at least one barrier, wherein an aluminum nitride molar fraction of each of the at least one well and each of the at least one barrier in the p-type superlattice layer is lower than an average aluminum nitride molar fraction of the region of graded composition in the electron blocking layer; and
a p-type contact layer located adjacent to the p-type superlattice layer, wherein the p-type contact layer has a p-type dopant concentration that is higher than a p-type dopant concentration in the p-type superlattice layer.

12. The device of claim 11, wherein the electron blocking layer includes a region of constant composition adjacent to the region of graded composition.

13. The device of claim 11, wherein the electron blocking layer includes a second region of graded composition.

14. The device of claim 11, wherein an interface between the active region and the electron blocking layer includes a graded region having an aluminum nitride molar fraction that increases from an aluminum nitride molar fraction of the at least one barrier of the active region to a maximum aluminum nitride molar fraction of the electron blocking layer.

15. The device of claim 11, wherein the p-type superlattice layer comprises at least one superlattice period comprising a plurality of wells and a plurality of barriers, and wherein the thickness of each well in the plurality of wells in the at least one superlattice period increases along the length of the p-type superlattice layer and away from the electron blocking layer.

16. The device of claim 11, wherein the p-type superlattice layer comprises at least one superlattice period comprising a plurality of wells and a plurality of barriers, and wherein the thickness of each barrier in the plurality of barriers in the at least one superlattice period decreases along the length of the p-type superlattice layer and away from the electron blocking layer.

17. The device of claim 11, wherein the p-type superlattice layer comprises at least one superlattice period comprising a plurality of wells and a plurality of barriers, and wherein a bandgap energy decreases in a direction away from the electron blocking layer in the at least one superlattice period.

18. The device of claim 11, an aluminum nitride molar fraction of the at least one well in the p-type superlattice layer is higher than an aluminum nitride molar fraction of the at least one quantum well in the active region.

19. The device of claim 11, wherein an average bandgap of each barrier and well pair of the p-type superlattice layer is larger than an average bandgap of the active region.

20. An optoelectronic device comprising:
a group III nitride n-type contact layer;
a group III nitride active region including at least one quantum well and at least one barrier, wherein the active region is located adjacent to the n-type contact layer;
a group III nitride electron blocking layer located adjacent to the active region, wherein the electron blocking layer includes a region of graded composition formed by a composition having an aluminum nitride molar fraction that continuously increases or continuously decreases with distance from the active region;
a group III nitride p-type superlattice layer located adjacent to the electron blocking layer, wherein the p-type superlattice layer includes at least one superlattice period comprising a plurality of wells and a plurality of barriers, wherein an aluminum nitride molar fraction of each of the plurality of wells and each of the plurality of barriers in the at least one superlattice period is lower than an average aluminum nitride molar fraction of the region of graded composition in the electron blocking layer, and wherein a thickness of at least one of: each well in the plurality of wells or each barrier in the plurality of barriers varies along a length of the p-type superlattice layer; and
a group III nitride p-type contact located adjacent to the p-type superlattice layer.

* * * * *